US010810936B2

(12) United States Patent
Wang et al.

(10) Patent No.: US 10,810,936 B2
(45) Date of Patent: Oct. 20, 2020

(54) PIXEL CIRCUIT AND DRIVE METHOD THEREOF AND DISPLAY PANEL

(71) Applicant: BOE TECHNOLOGY GROUP CO., LTD., Beijing (CN)

(72) Inventors: Pengpeng Wang, Beijing (CN); Xue Dong, Beijing (CN); Haisheng Wang, Beijing (CN); Xiaoliang Ding, Beijing (CN); Yingming Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1 day.

(21) Appl. No.: 16/070,927

(22) PCT Filed: Dec. 19, 2017

(86) PCT No.: PCT/CN2017/117178
§ 371 (c)(1),
(2) Date: Jul. 18, 2018

(87) PCT Pub. No.: WO2018/218936
PCT Pub. Date: Dec. 6, 2018

(65) Prior Publication Data
US 2019/0279566 A1 Sep. 12, 2019

(30) Foreign Application Priority Data
Jun. 2, 2017 (CN) .......................... 2017 1 0407689

(51) Int. Cl.
*G09G 3/3233* (2016.01)
*G06K 9/00* (2006.01)
(Continued)

(52) U.S. Cl.
CPC ........... *G09G 3/3233* (2013.01); *G06K 9/001* (2013.01); *G06K 9/0004* (2013.01);
(Continued)

(58) Field of Classification Search
CPC .......... G09G 3/3233; G09G 2300/0439–0465; G09G 2300/0842; G09G 3/3241;
(Continued)

(56) References Cited

U.S. PATENT DOCUMENTS

2002/0044208 A1\* 4/2002 Yamazaki ......... H01L 27/14623
348/272
2006/0214893 A1 9/2006 Tseng et al.
(Continued)

FOREIGN PATENT DOCUMENTS

CN 1242312 C 2/2006
CN 101943974 A 1/2011
(Continued)

OTHER PUBLICATIONS

First Chinese Office Action dated Dec. 5, 2018.
International Search Report and Written Opinion dated Mar. 21, 2018.

*Primary Examiner* — Stephen G Sherman
(74) *Attorney, Agent, or Firm* — Dilworth & Barrese, LLP.; Michael J. Musella, Esq.

(57) ABSTRACT

A pixel circuit and a drive method thereof and a display panel are provided. The pixel circuit includes a light-emitting element, a light-emitting control circuit and a photoelectric sense circuit. The light-emitting control circuit is configured to drive the light-emitting element to emit light and includes a first end, a second end and a third end; the first end is connected with a first power supply terminal, and the second end is connected with one end of the light-emitting element. Other end of the light-emitting element is connected with a second power supply terminal. The photoelectric sense circuit is configured to sense light incident thereon and includes a sense signal output end and a sense voltage input end, the sense voltage input end is connected with the second power supply terminal, and the sense signal output end is connected with the third end of the light-emitting control circuit.

19 Claims, 12 Drawing Sheets

(51) Int. Cl.
  *G09G 3/3241* (2016.01)
  *H01L 27/32* (2006.01)

(52) U.S. Cl.
  CPC ....... *G09G 3/3241* (2013.01); *H01L 27/3244* (2013.01); *G06K 2009/0006* (2013.01); *G09G 2300/0842* (2013.01)

(58) Field of Classification Search
  CPC ................ G06K 9/0004; G06K 9/001; G06K 2009/0006; H01L 27/3244
  See application file for complete search history.

(56) References Cited

U.S. PATENT DOCUMENTS

| | | |
|---|---|---|
| 2010/0013811 A1 | 1/2010 | Ahn et al. |
| 2010/0097352 A1 | 4/2010 | Ahn et al. |
| 2011/0001711 A1 | 1/2011 | Choi |
| 2011/0273397 A1 | 11/2011 | Hanari |
| 2015/0002414 A1 | 1/2015 | Tan et al. |
| 2015/0103037 A1 | 4/2015 | Wu et al. |
| 2015/0125973 A1 | 5/2015 | Choi |
| 2015/0130785 A1* | 5/2015 | Shin ..................... G09G 3/3233 345/213 |
| 2015/0268763 A1 | 9/2015 | Zhou et al. |
| 2015/0325171 A1 | 11/2015 | Zhou et al. |
| 2017/0045972 A1 | 2/2017 | Xu |
| 2017/0269747 A1 | 9/2017 | Hu |
| 2018/0203046 A1* | 7/2018 | Takemura .......... G01R 19/2506 |

FOREIGN PATENT DOCUMENTS

| | | |
|---|---|---|
| CN | 103295525 A | 9/2013 |
| CN | 103354079 A | 10/2013 |
| CN | 103413523 A | 11/2013 |
| CN | 103413524 A | 11/2013 |
| CN | 103927988 A | 7/2014 |
| CN | 105118438 A | 12/2015 |
| CN | 106409224 A | 2/2017 |
| CN | 107204172 A | 9/2017 |
| TW | 200635351 A | 10/2006 |

* cited by examiner

US 10,810,936 B2

1

PIXEL CIRCUIT AND DRIVE METHOD THEREOF AND DISPLAY PANEL

The application claims priority to the Chinese patent application No. 201710407689.3, filed on Jun. 2, 2017, the entire disclosure of which is incorporated herein by reference as part of the present application.

TECHNICAL FIELD

Embodiments of the present disclosure relate to a pixel circuit and a drive method thereof, and a display panel.

BACKGROUND

An organic light-emitting diode (OLED) display panel is attracting extensive attention of people due to its advantages such as wide view angle, high contrast, fast response speed, high luminance, low driving voltage, and adaptability to flexible display and the like. As a new-generation display mode, the OLED display panel is widely applied in electronic products such as cellphones, computers, full-color televisions, digital cameras, personal digital assistants and the like.

With rapid development of display technology, electronics devices with a biological recognition function have gradually entered people's work and life. Fingerprint identification recognition technology is highly valued due to uniqueness of identity. Nowadays, the fingerprint identification recognition technology of push type and slide type based on silicon process are gradually integrated into kinds of electronics products, and OLED display panels with fingerprint identification recognition function also becomes a research hotspot of display panels.

SUMMARY

At least an embodiment of the present disclosure provides a pixel circuit, and the pixel circuit comprises a light-emitting element, a light-emitting control circuit and a photoelectric sense circuit. The light-emitting control circuit is configured to drive the light-emitting element to emit light and comprises a first end, a second end and a third end; the first end is configured to be connected with a first power supply terminal, and the second end is configured to be connected with the light-emitting element; one end of the light-emitting element is configured to be connected with the second end of the light-emitting control circuit, and other end of the light-emitting element is configured to be connected with a second power supply terminal; and the photoelectric sense circuit is configured to sense light incident on the photoelectric sense circuit and comprises a sense signal output end and a sense voltage input end, the sense voltage input end is configured to be connected with the second power supply terminal, and the sense signal output end is configured to be connected with the third end of the light-emitting control circuit.

At least an embodiment of the present disclosure further provides a display panel comprising pixel units disposed in an array. At least one of the pixel units comprises the above-mentioned pixel circuit.

At least an embodiment of the present disclosure further provides a drive method of the above-mentioned pixel circuit, comprising: during a display period, driving the light-emitting element to emit light by the light-emitting control circuit; during a photoelectric sense period, outputting a predetermined current from the third end of the light-emitting control circuit to the photoelectric sense circuit and reading an output signal of the photoelectric sense circuit.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 9b is an exemplary timing diagram of a drive method of the pixel circuit as illustrate in FIG. 9a.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

To render below descriptions about embodiments of the present disclosure clear and concise, detailed descriptions of the know functions and the know components are omitted by the present disclosure.

Fingerprint recognition technology mainly comprises capacitive technology, ultrasonic technology, optical technology and the like. The optical fingerprint recognition technology adopt optical detection manners and achieve detection and recognition functions by detecting electrical signals converted from optical signals, and have advantages such as high sensitivity, high stability, long service life and long-distance sensitivity and the like. Organic light-emitting diode display panels having fingerprint recognition functions can, for example, adopt the optical fingerprint recognition technology.

Figure 1:
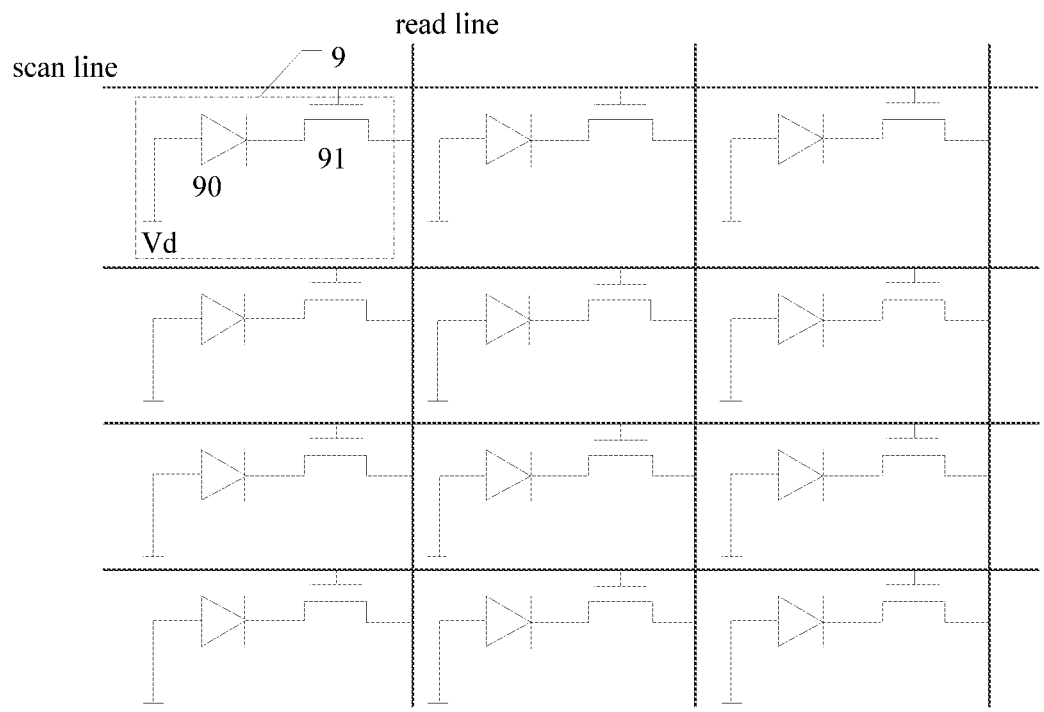
FIG. 1 is a schematic plan view of a circuit diagram of an optical fingerprint recognition device.

FIG. 1 illustrates a schematic plan view of a circuit diagram of an optical fingerprint recognition device.

For example, as illustrated in FIG. 1, the optical fingerprint recognition device comprises a plurality of scan lines, a plurality of read lines and a plurality of photoelectric sense circuits 9 arranged in an array. Each photoelectric sense circuit 9 is disposed within a sub-pixel. Here, the photoelectric sense circuit 9 adopts a passive detection method. For example, each photoelectric sense circuit 9 comprises a photodiode 90 and an output transistor 91, the photodiode 90 is configured to convert an optical signal to a sense electrical signal, and the output transistor 91 is configured to control the sense electrical signal generated by the photodiode 90 to be outputted to a read line. One end of the photodiode 90 is connected with a power supply voltage terminal Vd, and the other end is connected with a first electrode of the output transistor 91. A control electrode of the output transistor 91 is connected with a scan line to receive a scan control signal, and the second electrode of the output transistor 91 is connected with a read line.

For example, the specific process of fingerprint recognition can be as follows, during a photosensitive accumulation period, a light source irradiates on a finger, and the finger reflects the incident light, the reflected light irradiates on the photodiode 90, and the photodiode 90 converts an optical signal of the reflected light to a sense electrical signal corresponding to intensity of the optical signal, because geometrical characteristics of ridge lines and valley lines of the fingerprint are different and the ridge lines are convex and the valley lines are concave, the ridge lines and the valley lines reflect light with different light intensity when being illuminated by light, which results in different sense electrical signals output by the photodiodes 90 at different locations; during an output period, the control electrode of the output transistors 91 receives turn-on signals transmitted by the scan lines, and the output transistors 91 are turned on sequentially, so that the read lines can sequentially read out the sense electrical signals generated by respective photodiodes 90, the ridge lines and the valley lines of the fingerprint can be detected by detecting the values of the sense electrical signals, so that the fingerprint recognition is achieved.

Because the sense electrical signals generated by the photodiodes 90 are small, the passive photoelectric sense circuit 9 has limited detection capability, high detection difficulty, low precision of the detected sense electrical signals and a low signal-to-noise ratio. Besides, the read line is connected with the photodiodes 90 in a column, so that the sense electrical signals generated by all the photodiodes 90 of each column would interfere with each other, thus the detecting precision is affected.

At least an embodiment of the present disclosure provides a pixel circuit and a drive method thereof and a display panel. The pixel circuit comprises a light-emitting element, a light-emitting control circuit and a photoelectric sense circuit. The light-emitting control circuit is configured to drive the light-emitting element to emit light and comprises a first end, a second end and a third end; the first end is configured to be connected with a first power supply terminal, and the second end is configured to be connected with the light-emitting element; one end of the light-emitting element is configured to be connected with the second end of the light-emitting control circuit and another end of the light-emitting element is configured to be connected with a second power supply terminal; the photoelectric sense circuit is configured to sense light incident on the photoelectric sense circuit and comprises a sense signal output end and a sense voltage input end, the sense voltage input end is configured to be connected with the second power supply terminal, and the sense signal output end is configured to be connected with the third end of the light-emitting control circuit.

In at least one embodiment of the present disclosure, the photoelectric sense circuit of the pixel unit adopts an active detecting method, and the constant current generated by the light-emitting control circuit is time-multiplexed, so that the sense electrical signal can be detected with a high precision and the signal-to-noise ratio of the sense electrical signal is increased. Besides, at least one embodiment of the present disclosure can further reduce the space occupied by the photoelectric sense circuit, optimize the structural layout of the pixel circuit, reduce the manufacturing cost and promote the additional value of the products.

For example, transistors can be categorized as an N-type transistor and a P-type transistor. For clarity, embodiments of the present disclosure illustrate technical solutions of the present disclosure in detail by taking the transistors as P-type transistors as an example. Those skilled in the art can use N-type transistors to achieve the function of one or more transistors of the embodiments of the present disclosure according to practical requirements.

It should be noted that transistors adopted in the embodiments of the present disclosure can be thin-film transistors or field-effect transistors, or other switch elements with same characteristics. A source electrode and a drain electrode of a transistor are symmetrical in structure and therefore can have no difference in physical structure. In the embodiments of the present disclosure, in order to distinguish two electrodes of the transistor apart from a gate electrode, one of the two electrodes is directly described as a first electrode, and the other of the two electrodes is described as a second electrode. Therefore, the first electrode and the second electrode of part of or all of the transistors of the embodiments of the present disclosure are interchangeable according to need. For example, for an N-type transistor, the first electrode of the transistor can be a source electrode, the second electrode can be a drain electrode; or, for a P-type transistor, the first electrode of the transistor can be a drain electrode and the second electrode can be a source electrode.

The pixel circuit and the drive method of pixel circuit and the display panel provided by the present disclosure are illustrated through several embodiments below, but the present disclosure is not limited to these specific embodiments.

An embodiment of the present disclosure provides a pixel circuit.

Figure 2A:
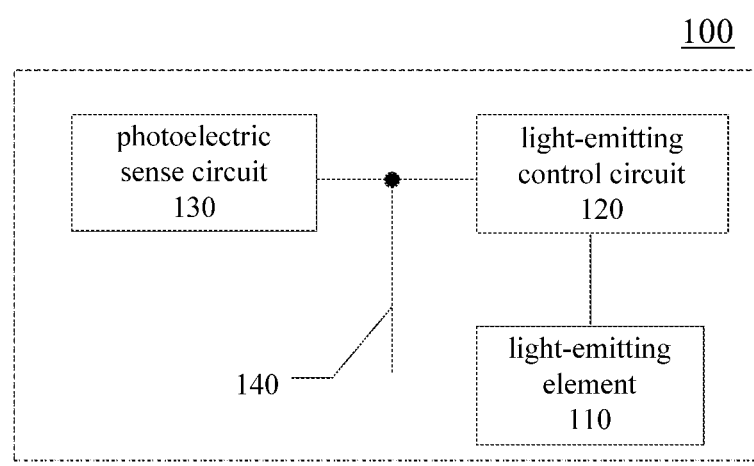
FIG. 2a is a schematic block diagram of a pixel circuit provided by an embodiment of the present disclosure.
Figure 2B:
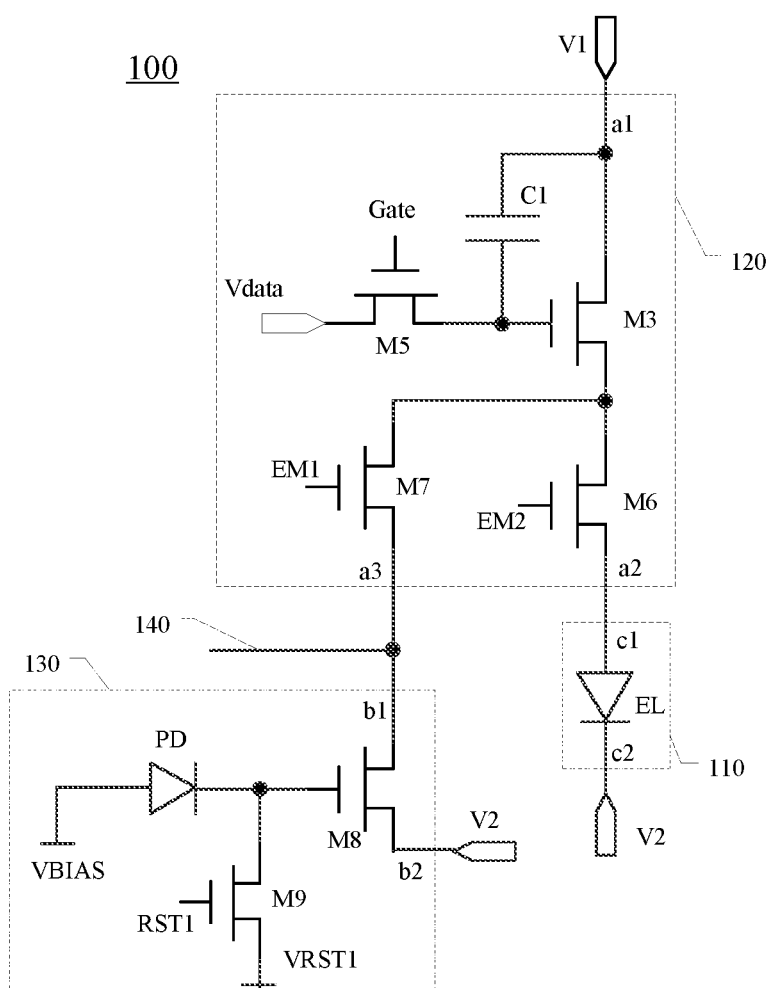
FIG. 2b is a schematic circuit diagram of a pixel circuit provided by an embodiment of the present disclosure.

For example, as illustrated in FIG. 2a and FIG. 2b, a pixel circuit 100 provided by the embodiment of the present disclosure can comprise a light-emitting element 110 (e.g. maybe the light-emitting element EL illustrated in FIG. 2b), a light-emitting control circuit 120 and a photoelectric sense circuit 130. The pixel circuit 100 provided by the embodiment of the present disclosure can be for example applied to a display panel, such as an active-matrix organic light-emitting diode (AMOLED) display panel and the like.

For example, specific structures of the light-emitting element 110, the light-emitting control circuit 120 and the photoelectric sense circuit 130 can be provided according to practical application requirements, which is not specifically limited by the embodiments of the present disclosure. For example, a pixel circuit 100 provided by an embodiment of the present disclosure can be implemented as the circuit structure illustrated in FIG. 2b.

For example, as illustrated in FIG. 2b, the light-emitting element 110 is configured to emit light when applied with a voltage or a current. A first end c1 of the light-emitting element 110 is configured to be connected with the second end a2 of the light-emitting control circuit 120, and the second end c2 of the light-emitting element 110 is configured to be connected with a second power supply terminal V2. The light-emitting element 110 can be an organic light-emitting element, and the organic light-emitting element can be an organic light-emitting diode for example, which is however not limited by the embodiments of the present disclosure. The light-emitting element 110 can, for example, adopt different light-emitting materials to emit light of different colors, so as to achieve colorful light emission.

For example, in an example, as illustrated in FIG. 2a and FIG. 2b, the pixel circuit 100 can further comprise a signal line 140. The signal line 140 is configured to receive and read out a sense electrical signal output from a sense signal output end b1 of the photoelectric sense circuit 130.

Figure 2C:
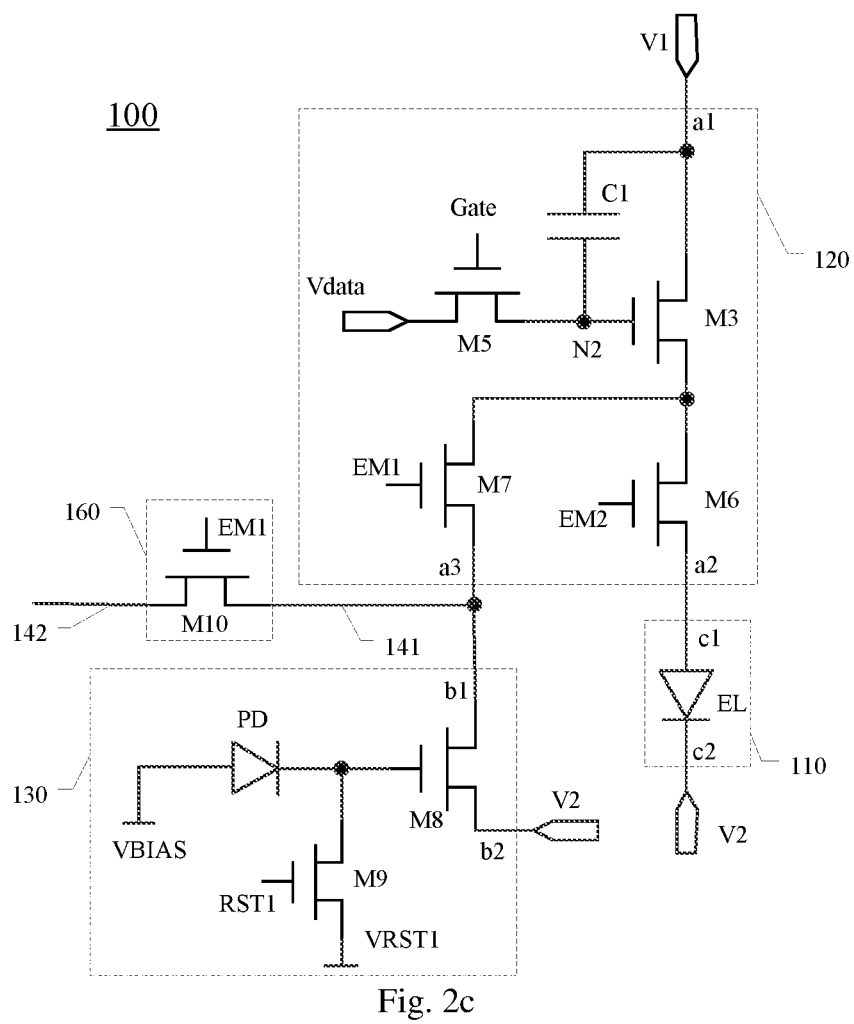
FIG. 2c is a schematic circuit diagram of another pixel circuit provided by an embodiment of the present disclosure.

For example, in an example, as illustrated in FIG. 2c, based on FIG. 2b, the pixel circuit 100 can further comprise a signal readout switch circuit 160. In a case that one signal line 140 is shared by a plurality of photoelectric sense circuits 130, the signal readout switch circuit 160 can control the signal line 140 to read the sense electrical signal output by a single photoelectric sense circuit 130, so as to prevent sense electrical signals output by the respective photoelectric sense circuits 130 from interfering with each other. The noise is reduced and the signal-to-noise ratio of the sense electrical signal is guaranteed.

For example, as illustrated in FIG. 2c, the signal line 140 comprises a first portion 141 and a second portion 142, the signal readout switch circuit 160 is disposed between the first portion 141 and the second portion 142 and is configured to control connection or disconnection between the first portion 141 and the second portion 142. The first portion 141 is configured to be connected with the sense signal output end b1 of the photoelectric sense circuit 130. For example, the signal readout switch circuit 160 comprises a signal readout switch transistor M10. A control electrode of the signal readout switch transistor M10 can receive a first output signal EM1. A first electrode of the signal readout switch transistor M10 is connected with one end of the second portion 142, and the other end of the second portion 142 is connected, for example, with a touch chip (not shown). A second electrode of the signal readout switch transistor M10 is connected with one end of the first portion 141, and the other end of the first portion 141 is connected with the sense signal output end b1 of the photoelectric sense circuit 130.

For example, the third end a3 of the light-emitting control circuit 120 is connected with the sense signal output end b1 of the photoelectric sense circuit 130, and the signal line 140 is configured to be connected with the third end a3 and the sense signal output end b1. In this way, during a touch detection period and/or a fingerprint recognition period, the third end a3 of the light-emitting control circuit 120 can input a constant and controllable predetermined current to the sense signal output end b1 of the photoelectric sense circuit 130, so that the sense electrical signal of the photoelectric sense circuit 130 can be output to the sense signal output end b1 of the photoelectric sense circuit 130, and then the sense electrical signal can be read out through the signal line 140, so as to achieve the touch detection or the fingerprint recognition. Or, during a display period, the second end a2 of the light-emitting control circuit 120 can input a light-emitting current signal corresponding to a light-emitting data voltage to the light-emitting element 110 so as to achieve the light-emitting display. In this way, the constant current generated by the light-emitting control circuit 120 can be time-multiplexed by the photoelectric sense circuit 130, so as to achieve a high-precision detection of the sense electrical signal and to increase the signal-to-noise ratio of the sense electrical signal. In other words, during a photoelectric sense period, the light-emitting control circuit 120 can be equated as a current source. The pixel circuit can further reduce the space occupied by the photoelectric sense circuit, optimize the structural layout of the pixel circuit 100, reduce the manufacturing cost and promote the additional value of the products.

For example, the photoelectric sense circuit 130 provided by the embodiments of the present disclosure are described below in details in combination with FIG. 3a and FIG. 3b.

For example, the photoelectric sense circuit 130 is configured to sense the intensity of light incident on the photoelectric sense circuit 130 and to generate a sense electrical signal which can be used to determine whether a touch action occurs or not and also be used to achieve fingerprint recognition. For example, the photoelectric sense circuit 130 is configured to determine whether a touch action occurs or not by sensing intensity of light, which is emitted from a light source module (e.g. the light-emitting element 110), reflected by a finger due to a touch operation or a touch pen and incident on the photoelectric sense circuit. Or, the photoelectric sense circuit 130 can also be configured to determine whether a touch action occurs or not by sensing intensity of ambient light which is incident on the photoelectric sense circuit 130. Still, for example, the photoelectric sense circuit 130 can be disposes in an array comprising m rows and n columns (m and n are integers). By integrating sense electrical signals output by a plurality of photoelectric sense circuits 130, a two-dimension fingerprint pattern comprised of ridge lines and valley lines can be obtained and fingerprint recognition can be achieved.

Figure 3A:
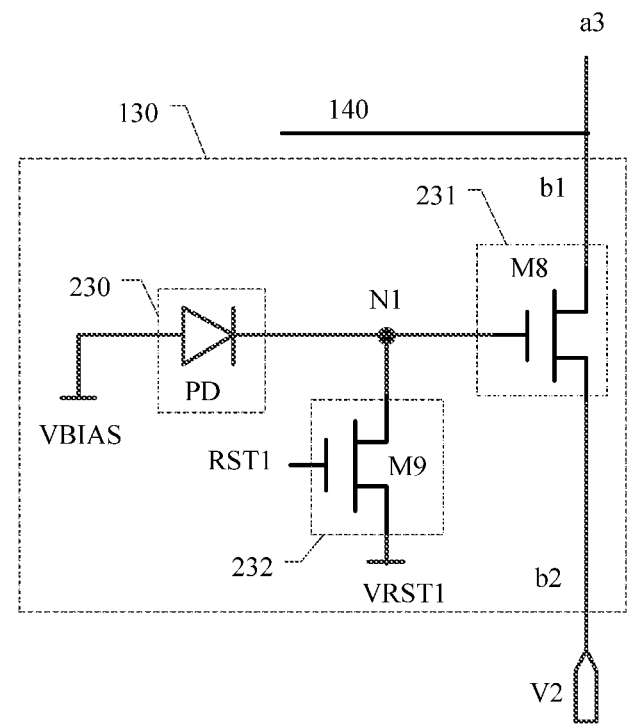
FIG. 3a is a schematic circuit diagram of a photoelectric sense circuit provided by an embodiment of the present disclosure.

For example, as illustrated in FIG. 3a, in an example, the photoelectric sense circuit 130 can comprise a photosensitive element 230 and an amplification circuit 231. The photosensitive element 230 is configured to convert light incident on the photosensitive element 230 to a sense electrical signal, and the amplification circuit 231 is configured to amplify the sense electrical signal output by the photosensitive element 230, so that a signal-to-noise ratio of the sense electrical signal of the photoelectric sense circuit 130 can be increased. In other words, the pixel circuit 100 provided by the embodiments of the present disclosure can guarantee or improve the signal-to-noise ratio of the sense electrical signal in a condition that the circuit layout is optimized.

For example, the photosensitive element 230 can comprise a photodiode PD, the photodiode PD can sense the intensity of light incident on the photodiode PD, and the light can cause a change in a reverse current of the photodiode PD. For example, the photodiode PD can comprise a PN-j unction type photodiode, PIN-j unction type photodiode, an avalanche type photodiode, a Schottky photodiode and the like. It should be noted that the photosensitive element 230 can further comprise other suitable elements, for example, a photovoltaic detector such as a metal-oxide-metal structure photodiodes with electrical contact and photoelectric transistors.

For example, the photoelectric sense circuit 130 can further comprise a first node N1, and the amplification circuit 231 can comprise a source follow transistor M8. The source follow transistor M8 comprises a control electrode, a first electrode and a second electrode, and the photodiode PD comprises a first end and a second end. For example, the first node N1 is disposed between the control electrode of the source follow transistor M8 and the second end of the photodiode PD. The first end of the photosensitive element 230 is connected with a biased voltage terminal VBIAS and the second end of the photosensitive element 230 can be connected with the first node N1. The second end of the photosensitive element 230 is configured to control the control electrode of the source follow transistor M8. The control electrode of the source follow transistor M8 is also connected with the first node N1, and the first electrode of the source follow transistor M8 can be configured as the sense signal output end b1 of the photoelectric sense circuit 130, that is, the first electrode of the source follow transistor M8 can be configured to be connected with the third end a3 of the light-emitting control circuit 120, so as to receive the constant predetermined current transmitted form the light-emitting control circuit 120, the first electrode of the source follow transistor M8 is also connected with the signal line 140 to output the sense electrical signal. The second electrode of the source follow transistor M8 can be configured as a sense voltage input end b2 of the photoelectric sense circuit 130, and the sense voltage input end b2 is configured to be connected with the second power supply terminal V2, that is, the second electrode of the source follow transistor M8 can be connected with the second power supply terminal V2 to receive a second power voltage signal output from the second power supply terminal V2.

For example, as illustrated in FIG. 3a, in an example, the photoelectric sense circuit 130 can further comprise a reset circuit 232. An output end of the reset circuit 232 is connected between the photosensitive element 230 and the amplification circuit 231, and the reset circuit 232 is configured to reset a voltage at an output node of the photodiode PD (for example corresponding to the first node N1 in FIG. 3a). The reset circuit 232 can comprise a reset transistor M9. A control electrode of the reset transistor M9 is configured to receive a reset signal RST1, a first electrode of the reset transistor M9 is connected with the first node N1, a second electrode of the reset transistor M9 is connected with a reset power terminal VRST1 to receive a reset voltage, and the first electrode of the reset transistor M9 can be provided as the output end of the reset circuit 232.

Figure 3B:
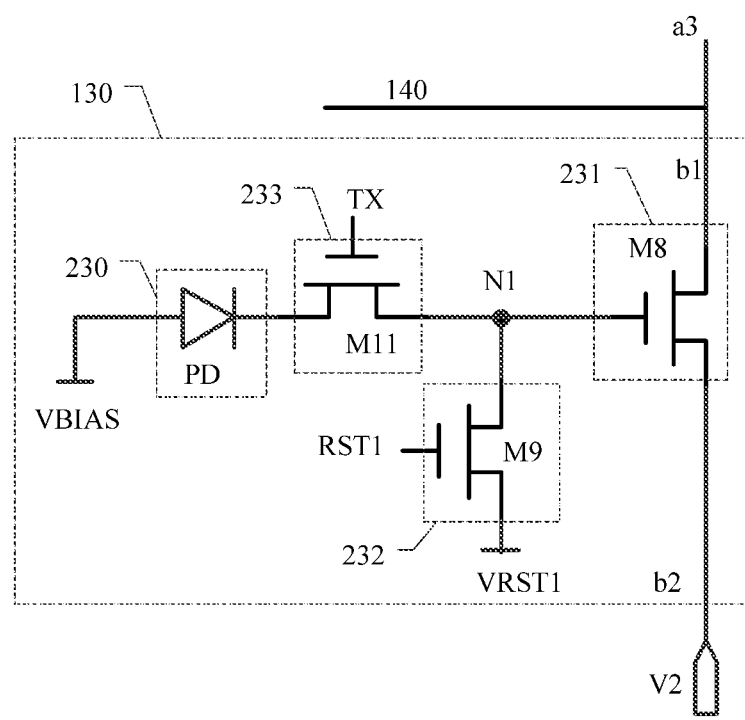
FIG. 3b is a schematic circuit diagram of another photoelectric sense circuit provided by an embodiment of the present disclosure.

For example, as illustrated in FIG. 3b, in another example, the photoelectric sense circuit 130 can further comprise a buffer switch circuit 233, and the buffer switch circuit 233 is disposed between the photosensitive element 230 and the amplification circuit 231 and is configured to control connection or disconnection between the photosensitive element 230 and the amplification circuit 231. In this way, whether or not the sense electrical signal generated by the photodiode PD responding to the incident light is output can be controlled.

For example, the buffer switch circuit 233 can comprise a buffer transistor M11. A first electrode of the buffer transistor M11 is connected with the first node N1, a second electrode of the buffer transistor M11 is connected with the second end of the photodiode PD, and a control end of the buffer transistor M11 is configured to receive a buffer control signal TX. The sense electrical signal generated by the photodiode PD can be buffered by the buffer transistor M11 first and then can follow to the control end of the source follow transistor M8, so as to increase the signal-to-noise ratio of the sense electrical signal.

For example, in a case that the photoelectric sense circuit 130 comprises the photodiode PD, the source follow transistor M8, the reset transistor M9 and the buffer transistor M11, the photoelectric sense circuit 130 can achieve the touch detection function and/or the fingerprint recognition function by following operations:

S110: during a reset period, making the reset transistor M9 be in a turn-on state and writing a reset voltage to the first node N1 through the reset transistor M9.

S120: during a photoelectric convert period, making the reset transistor M9 be in a turn-off state, making the buffer transistor M11 in a turn-off state, and generating and accumulating the sense electrical signal by the photodiode PD.

S130: during a signal readout period, making the buffer transistor M11 be in a turn-on state to write the sense electrical signal to the first node N1, controlling the third end a3 of the light-emitting control circuit 120 to provide a constant predetermined current to the first electrode of the source follow transistor M8, and reading out the sense voltage of the first electrode of the source follow transistor M8 through the signal line 140.

For example, in the operation S110, the reset signal RST1 turns into a low level signal, and the buffer control signal TX maintains to be a high level signal. In this situation, the reset transistor M9 is turned on and the buffer transistor M11 is in a turn-off state, so that the voltage of the first node N1 can be set to the reset voltage. For example, the reset voltage can be a reference voltage, and the reference voltage can be a high level signal.

For example, in the operation S120, in a cast that the touch operation or the fingerprint recognition is performed, the reset signal RST1 turns into a high level signal, and the buffer control signal TX is also a high level signal. Thus, the buffer transistor M11 and the reset transistor M9 are both in a turn-off state. In a case that light emitted from the light source (e.g. the light-emitting element EL) is reflected by, for example, a finger, and irradiates onto the photodiode PD, light quantum is excited and electron-hole pairs are generated in the PN junction of the photodiode PD, so that the photodiode PD responds to the incident light and performs photoelectric conversion to generate the sense electrical signal, and the sense electrical signal is accumulated in the photodiode PD to generate a voltage.

For example, in the operation S130, the reset signal RST1 maintains to be a high level signal, the buffer control signal TX turns into a low level signal, so that the buffer transistor M11 is turned on. In this situation, the sense electrical signal can be written into the first node N1 via the buffer transistor M11, the voltage of the first node N1 drops, and the constant predetermined current output form the third end a3 of the light-emitting control circuit 120 can be applied to the first electrode of the source follow transistor M8, so that the sense voltage on the first node N1 follows from the control electrode of the source follow transistor M8 to the first electrode of the source follow transistor M8 and thus can be read out by the signal line 140.

For example, during the reset period, the constant predetermined current can be applied to the first electrode of the source follow transistor M8 by the third end a3 of the light-emitting control circuit 120, so that the reset voltage follows from the control electrode of the source follow transistor M8 to the first electrode of the source follow transistor M8 and then is read out by the signal line 140. The reset voltage can be a reference voltage, and the sense electrical signal can be obtained by making a difference between the reference voltage and the sense voltage. For example, a reference voltage can be preset in the signal readout circuit.

For example, the magnitude of the sense electrical signal is determined by the magnitude of the voltage of the control electrode of the source follow transistor M8 (i.e. the voltage of the first node N1), and the magnitude of the voltage of the control electrode of the source follow transistor M8 is determined by the accumulation value (the integral value) of the electrical signal of the photodiode PD during the photoelectric conversion period, that is, the intensity of light incident on the photodiode PD. In this way, the fingerprint recognition can be achieved by combining the sense electrical signals output by a plurality of photodiodes PD; or whether a touch operation exists at a position corresponding to the pixel circuit 100 or not can be determined according to the magnitude of the sense electrical signal output from the photodiodes PD. For example, compared to a case where no touch operation exists, in a case where a touch operation exists, the voltage of the first node N1 is lower, so the sense electrical signal obtained by the signal line 140 during the signal readout period is larger. In this way, a touch operation at the position corresponding to the pixel circuit 100 can be determined in a case where the magnitude of the sense electrical signal obtained by the signal line 140 is larger than a preset value, and no touch operation at the position corresponding to the pixel circuit 100 can be determined in a case that the magnitude of the sense electrical signal output by the photodiode PD is smaller than or equal to the preset value. For example, the preset value can be obtained through experimental determination. In this way, a display panel comprising the pixel circuit 100 can achieve the touch detection function and/or the fingerprint recognition function.

For example, the light-emitting control circuit 120 provided by the embodiments of the present disclosure is described in details below in combination with FIG. 4a and FIG. 4b. In the embodiments of the present disclosure, the light-emitting control circuit 120 can be implemented in a plurality of forms, for example, a conventional 2T1C light-emitting control circuit and other types of light-emitting control circuits developed on this basis, and these light-emitting control circuits can further have functions such as a compensation function and the like.

Figure 4A:
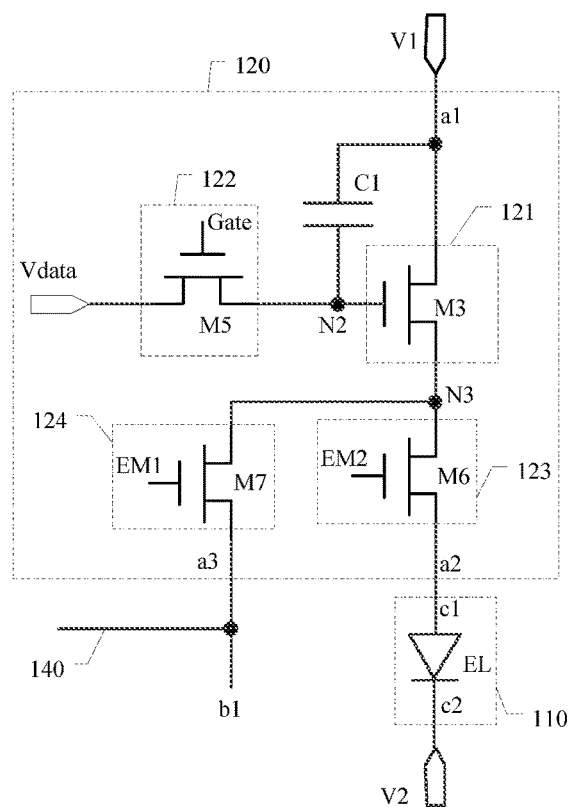
FIG. 4a is a schematic circuit diagram of a light-emitting control circuit provided by an embodiment of the present disclosure.

For example, as illustrated in FIG. 4a, the light-emitting control circuit 120 can be connected with the light-emitting element 110 and be configured to drive the light-emitting element 110 to emit light. The light-emitting control circuit 120 can comprise a first end a1, a second end a2 and a third end a3. The first end a1 is configured to be connected with a first power supply terminal V1, the second end a2 is configured to be connected with the first end c1 of the light-emitting element 110, and the third end a3 is configured to be connected with the sense signal output end b1 of the photoelectric sense circuit 130.

For example, the light-emitting control circuit 120 can comprise a light-emitting drive circuit 121, a light-emitting selection circuit 122 and a first capacitor C1. The light-emitting drive circuit 121 is configured to control a current flowing between the first end a1 and the second end a2 for driving the light-emitting element 110 to emit light, and the light-emitting drive circuit 121 is further configured to control a current flowing between the first end a1 and the third end a3. The light-emitting selection circuit 122 is configured to write a light-emitting data voltage into the control end of the light-emitting drive circuit 121. The first capacitor C1 can be configured to store the light-emitting data voltage and maintain the light-emitting data voltage at the control end of the light-emitting drive circuit 121. It should be noted that the specific structures of the light-emitting drive circuit 121, the light-emitting selection circuit 122 and the first capacitor C1 can be provided according to practical application requirements, and the embodiments of the present disclosure is not limited thereto.

For example, in an example, as illustrated in FIG. 4a, the light-emitting control circuit 120 further comprises a light-emitting switch circuit 123, and the light-emitting switch circuit 123 is disposed between the light-emitting drive circuit 121 and the light-emitting element 110 and is configured to control connection or disconnection between the light-emitting drive circuit 121 and the light-emitting element 110.

For example, in an example, as illustrated in FIG. 4a, the light-emitting control circuit 120 further comprises a photosensitive switch circuit 124. The photosensitive switch circuit 124 is disposed between the light-emitting drive circuit 121 and the photoelectric sense circuit 130, and is configured to control connection or disconnection between the light-emitting drive circuit 121 and the photoelectric sense circuit 130.

For example, in the example as illustrated in FIG. 4a, the light-emitting control circuit 120 can be implemented in a form of a 4T1C circuit, and the light-emitting switch circuit 123 and the photosensitive switch circuit 124 are added based on a conventional 2T1C circuit. That is, four thin-film transistors (TFT) and one storage capacitor are used to implement the basic function of driving the light-emitting element 110 (e.g. an OLED) to emit light, and further to control the photoelectric sense circuit 130 to output the sense electrical signal so as to achieve the touch detection function and the fingerprint recognition function.

For example, as illustrated in FIG. 4a, a 4T1C type light-emitting control circuit 120 can comprise a fifth transistor M5 (i.e. the light-emitting selection circuit 122), a third transistor M3 (i.e. the light-emitting drive circuit 121), a sixth transistor M6 (i.e. the light-emitting switch circuit 123), a photosensitive switch transistor M7 (i.e. the photosensitive switch circuit 124), a first capacitor C1, a second node N2 and a third node N3. For example, a control electrode of the fifth transistor M5 can receive a scan signal Gate, a first electrode of the fifth transistor M5 can be connected with a data signal terminal Vdata to receive a light-emitting data voltage Vdata1, and a second electrode of the fifth transistor M5 can be connected with the second node N2. For example, a control electrode of the third transistor M3 can be connected with the second node N2, a first electrode of the third transistor M3 can be connected with the third node N3, and a second electrode of the third transistor M3 can be connected with the first power supply terminal V1. For example, a first end of the first capacitor C1 is connected with the second node N2 (i.e. a node between the second electrode of the fifth transistor M5 and the control electrode of the third transistor M3), and a second end of the first capacitor C1 can be connected with the first power supply terminal V1. For example, a control electrode of the sixth transistor M6 can receive a second output signal EM2, a first electrode of the sixth transistor M6 can be connected with the first end c1 of the light-emitting element 110 (e.g. a positive end of an OLED), and a second electrode of the sixth transistor M6 is connected with the third node N3, that is, the first electrode of the third transistor M3. A second end c2 of the light-emitting element 110 (e.g. a negative end of an OLED) is connected with the second power supply terminal V2. For example, a control electrode of the photosensitive switch transistor M7 can receive a first output signal EMl, a first electrode of the photosensitive switch transistor M7 is connected with the sense signal output end b1 of the photoelectric sense circuit 130, and a second electrode of the photosensitive switch transistor M7 is connected with the third node N3, that is, the first electrode of the third transistor M3.

For example, as illustrated in FIG. 2c and FIG. 4a, the control electrode of the photosensitive switch transistor M7 and the control electrode of the signal readout switch transistor M10 can be connected to a same output signal line to receive a same first output signal EM1, and can also be connected to different output signal lines, while first output signals EM1 applied by the different output signal lines are synchronized.

For example, one of the first power supply terminal V1 and the second power supply terminal V2 is a high voltage terminal, and the other is a low voltage terminal. For example, the first power supply terminal V1 can be a voltage source to output a constant positive voltage, and the second power supply terminal V2 can be a ground terminal.

For example, a driving method of the 4T1C type light-emitting control circuit 120 is to control the light and shade (gray scales) of a pixel through four TFTs and one first capacitor C1. During the display period, a scan signal Gate is applied by a gate line to turn on the fifth transistor M5. The light-emitting data voltage Vdata1 output by the data drive circuit through the data line charges the first capacitor via the fifth transistor M5, so that the light-emitting data voltage Vdata1 is stored in the first capacitor C1. The stored light-emitting data voltage Vdata1 can control the conducting degree of the third transistor M3 so as to control the magnitude of the light-emitting current flowing through the third transistor M3. The second output signal EM2 is applied to the control electrode of the sixth transistor M6 to turn on the sixth transistor M6, and meanwhile the second output signal EM2 is configured to turn off the photosensitive switch transistor M7, so that the sixth transistor M6 can receive the light-emitting current flowing through the third transistor M3 and transmit the light-emitting current signal to the light-emitting element 110 to drive the light-emitting element 110 to emit light. The light-emitting current flowing through the third transistor M3 can determine the gray scale of the light emission of the pixel. During the photoelectric sense period, the first output signal EM1 is applied to the control electrode of the photosensitive switch transistor M7 to turn on the photosensitive switch transistor M7, and the first output signal EM1 is configured to turn off the sixth transistor M6, so that the photosensitive switch transistor M7 can receive a predetermined current transmitted by the third transistor M3 and transmit the predetermined current to the photoelectric sense circuit 130 to control the photoelectric sense circuit 130 to output the sense electrical signal, so as to achieve the touch detection function and the fingerprint recognition function. For example, the predetermined current can be a constant predetermined current.

For example, the embodiments of the present disclosure describe the light-emitting control circuit 120 only by taking the light-emitting control circuit 120 as a 4T1C circuit as an example, but the light-emitting control circuit 120 of the embodiments of the present disclosure is not limited to a 4T1C circuit. For example, according to actual application requirements, the light-emitting control circuit 120 can further have an electrical compensation function so as to improve the display uniformity of the display panel comprising the pixel circuit 100. For example, the compensation function can be implemented by voltage compensation, current compensation or hybrid compensation of the voltage compensation and the current compensation. The light-emitting control circuit 120 having the compensation function can be a 4T2C circuit, a 6T1C circuit or other light-emitting control circuit 120 having the electrical compensation functions.

For example, the light-emitting control circuit 120 can further comprise a light-emitting compensation circuit 125. The light-emitting compensation circuit 125 is configured to compensate the light-emitting drive circuit 121. The light-emitting compensation circuit 125 can be an internal compensation circuit or an external compensation circuit. FIG. 4b illustrates an exemplary circuit diagram of a light-emitting control circuit having the compensation function provided by an embodiment of the present disclosure.

Figure 4B:
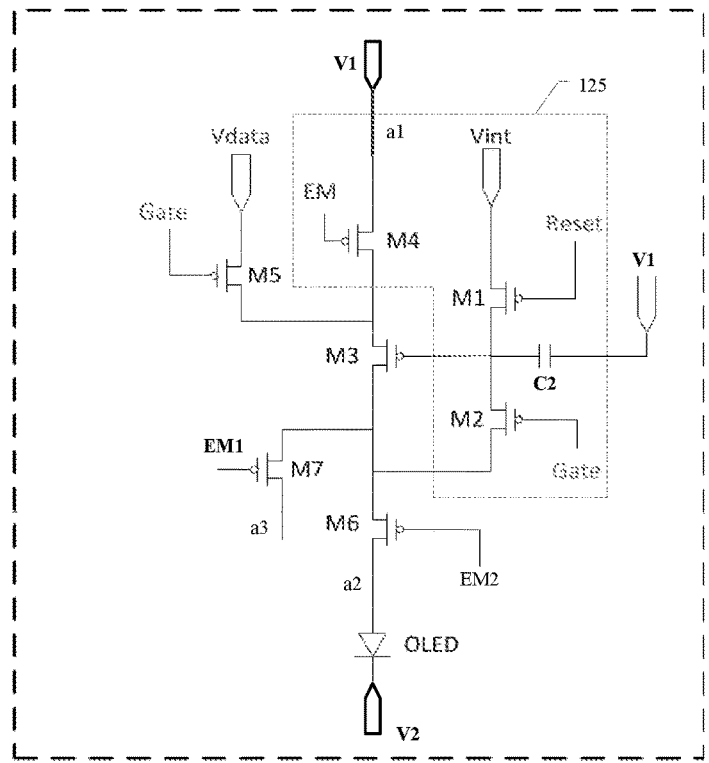
FIG. 4b is a schematic circuit diagram of another light-emitting control circuit provided by an embodiment of the present disclosure.

For example, as illustrated in FIG. 4b, the light-emitting compensation circuit 125 is an internal compensation circuit and can comprise a first transistor M1, a second transistor M2, a fourth transistor M4 and a second capacitor C2. The light-emitting compensation circuit 125 can compensate threshold voltage Vth drift of the third transistor M3.

FIG. 5a to FIG. 5d illustrate an operational process of a compensating method of the light-emitting control circuit as illustrated in FIG. 4b. It should be noted, in FIG. 5a and FIG. 5c, a block (□) located in a transistor indicates the transistor is in an on state and a circle (○) located in a transistor indicates the transistor is in an off state.

Figure 5A:
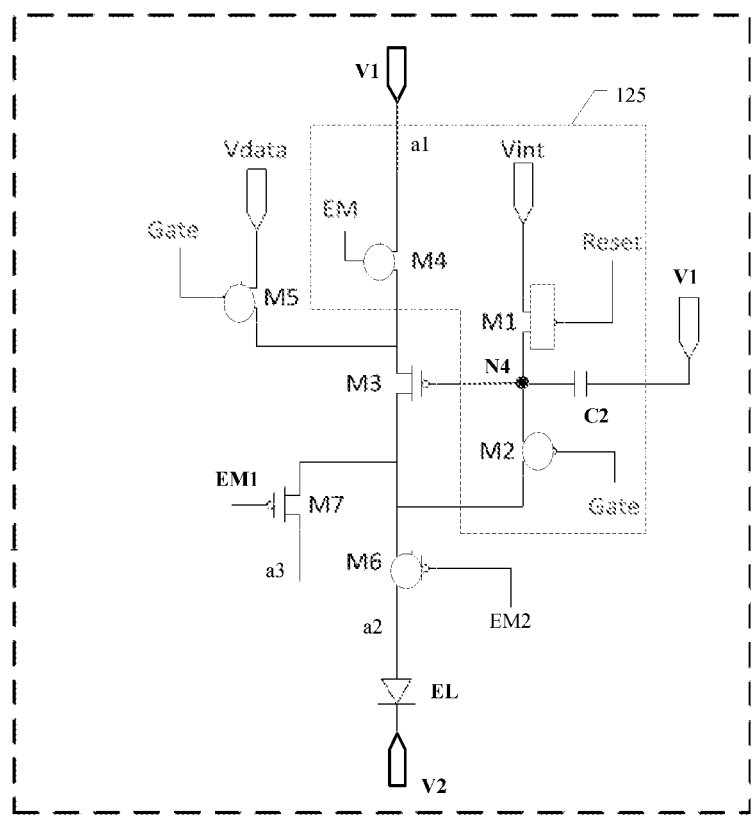
FIG. 5a-FIG. 5d illustrate an operational process of a compensating method of the light-emitting control circuit as illustrated in FIG. 4b.
Figure 5B:
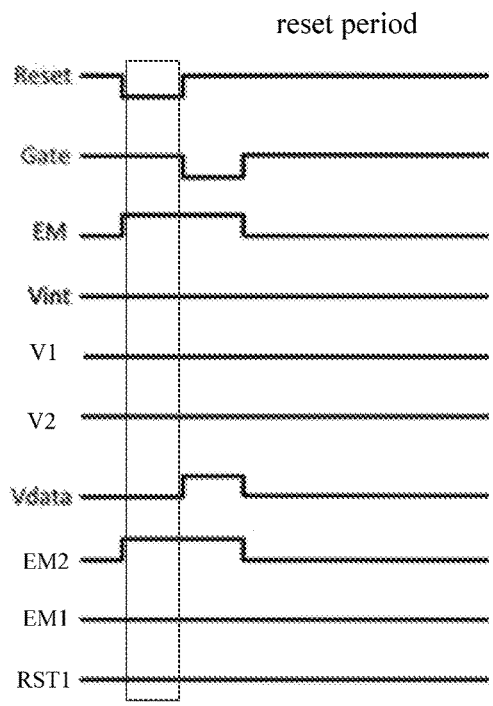

For example, as illustrated in FIG. 5a and FIG. 5b, during the reset period, the scan signal Gate, the power control signal EM, the first output signal EM1 and the second output signal EM2 are all high level signals, and the rese signal Reset is a low level signal, so that the first transistor M1 is turned on and the other transistors are turned off. At this moment, the first transistor M1 resets a voltage of the fourth node N4 to an initial voltage Vint. The initial voltage Vint is a low voltage signal for example.

Figure 5C:
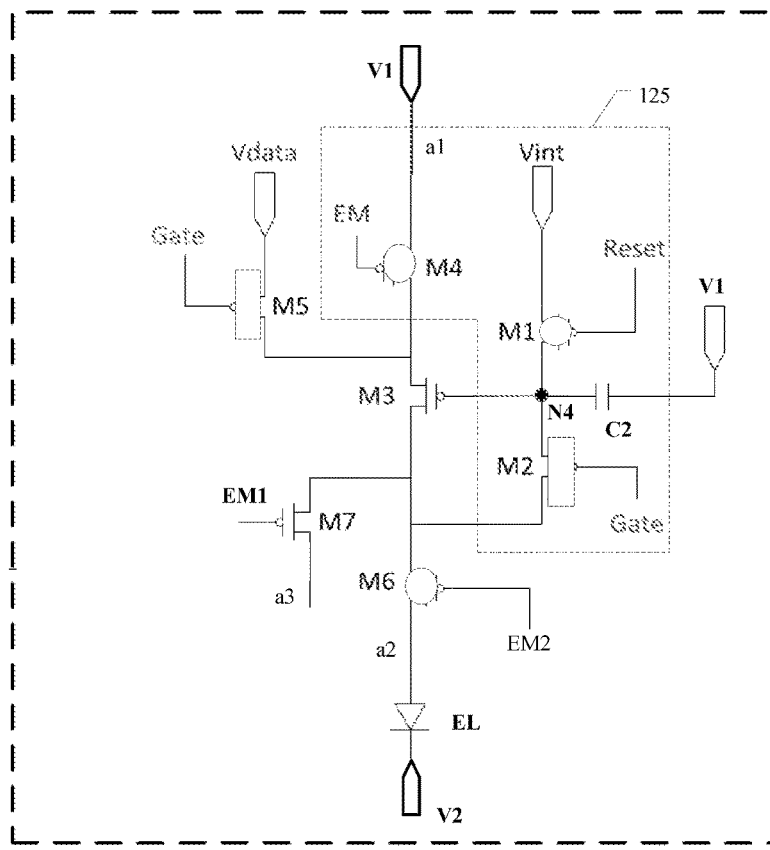
Figure 5D:
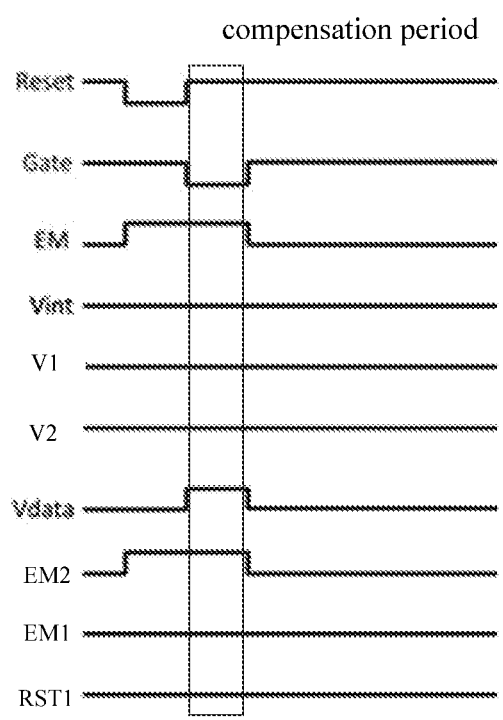

For example, as illustrated in FIG. 5c and FIG. 5d, during a compensation period, the scan signal Gate becomes a low level signal, the reset signal Reset becomes a high level signal, the power control signal EM, the first output signal EM1 and the second output signal EM2 all maintain to be high level signals. At this moment, the second transistor M2 and the fifth transistor M5 are turned on, and the other transistors are turned off. In this way, the fourth node N4 is charged through the fifth transistor M5 until the voltage of the fourth node N4 becomes Vdata1+Vth, where Vdata1 is the light-emitting data voltage output from the data signal terminal Vdata, and Vth is a threshold voltage of the third transistor M3. The voltage Vdata1+Vth is stored in the second capacitor C2. At this moment, a voltage on the control electrode of the third transistor M3 is Vdata1+Vth.

During the subsequent light-emitting period, the scan signal Gate becomes a high level signal, the reset signal and the first output signal EM1 maintain to be high level signals, and the power control signal EM and the second output signal EM2 become low level signals. At this moment, the first transistor M1, the second transistor M2 and the fifth transistor M5 are in an off state, the fourth transistor M4 and the sixth transistor M6 are in an on state, and the third transistor (the driving transistor) M3 is also in an on state meanwhile. Based on the saturation current formula of the third transistor M3, the light-emitting current signal flowing through the third transistor M3 can be obtained as follows:

$$Iout=K(VGS-Vth)^2=K[Vdata1+Vth-V1-Vth]^2=K(Vdata1-V1)^2$$

In the above formula, VGS is a voltage difference between the gate electrode and the source electrode of the third transistor M3, V1 is the first power voltage output from the first power supply terminal V1, and Vth is the threshold voltage of the third transistor M3. It can be seen from the above formula that the output current Iout is not affected by the threshold voltage Vth of the third transistor M3 and is only relevant to the first power voltage V1 output from the first power supply terminal V1 and the light-emitting data voltage Vdata1. The light-emitting data voltage Vdata1 is directly transmitted by the data signal terminal Vdata and is independent of the threshold voltage Vth of the third transistor M3. In this way, a problem that the threshold voltage Vth of the third transistor M3 drifts due to the manufacturing process and long-time operation can be solved, and the accuracy of the light-emitting current signal can be guaranteed.

For example, the light-emitting compensation circuit 125 can also be an external compensation circuit. For example, the light-emitting compensation circuit 125 can comprise a sense circuit to sense the electrical characteristics of the driving transistor or the electrical characteristics of the light-emitting element, and the specific structure of the light-emitting compensation circuit 125 can be referred to conventional designs, and similar descriptions are not repeated here.

For example, in the embodiments of the present disclosure, the photoelectric sense circuit 130 is provided in the pixel circuit 100 so that the display panel comprising the pixel circuit 100 can have the touch detection function and the fingerprint recognition function. The third end a3 of the light-emitting control circuit 120 and the sense signal output end b1 of the photoelectric sense circuit 130 are connected, so that the photoelectric sense circuit 130 can time-multiplex the predetermined current output by the light-emitting control circuit 120. In this way, the structural layout of the pixel circuit 100 can be optimized. In the embodiments of the present disclosure, the amplification circuit 231 is provided in the photoelectric sense circuit 130 so that the signal-to-noise ratio of the sense electrical signal can be guaranteed or improved in a condition that the circuit layout is optimized.

It should be noted that the photoelectric sense circuit can be replaced with other sensor circuits which need to operate with a constant current source, so as to detect other types of sensor signals.

An embodiment of the present disclosure provides a display panel, and the display panel further has a touch detection function, a fingerprint recognition function and so on. Thus, the display devices having the display panel can have more diverse functions and a more compact structure.

Figure 6A:
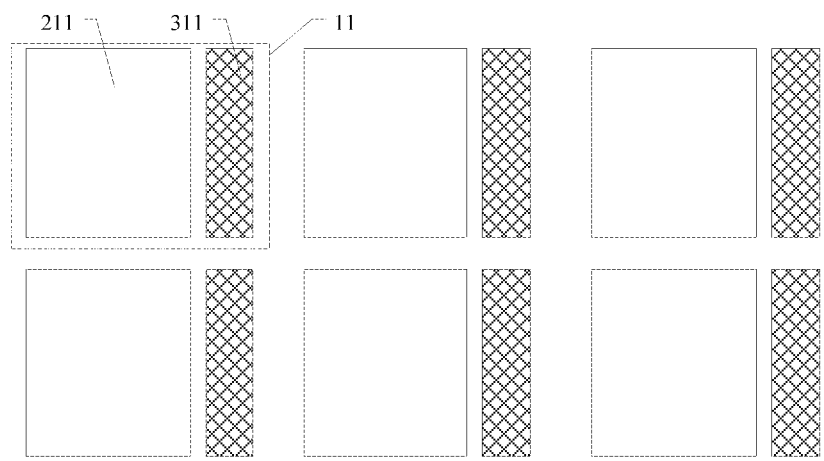
FIG. 6a is a schematic plan view of a display panel provided by an embodiment of the present disclosure.

For example, as illustrated in FIG. 6a, the display panel 10 comprises a plurality of pixel units arranged in an array. For clarity, FIG. 6a only illustrates two rows and three columns of pixel units 11 exemplarily, however the embodiments of the present disclosure are not limited thereto. For example, according to practical application requirements, the display panel 10 can comprise 1440 rows and 900 columns of pixel units 11.

For example, at least one pixel unit 11 comprises any one of the above-mentioned pixel circuits. As illustrated in FIG. 6a, in a case that the pixel unit 11 comprises any one of the above-mentioned pixel circuits, the pixel unit 11 can comprise a light-emitting area 211 and a light-sensing area 311. For example, as illustrated in FIG. 6a, the light-sensing area 311 can be disposed between two light-emitting areas 211 which are adjacent in a row direction. However the embodiments of the present disclosure are not limited thereto, the light-sensing area 311 can be also disposed between two light-emitting areas 211 which are adjacent in a column direction, or disposed among four adjacent light-emitting areas 211. It should be noted that the arrangement, the area ratio and the like of the light-sensing area 311 and the light-emitting area 211 can be designed according to practical application requirements, which is not specifically limited by the embodiments of the present disclosure.

Figure 6B:
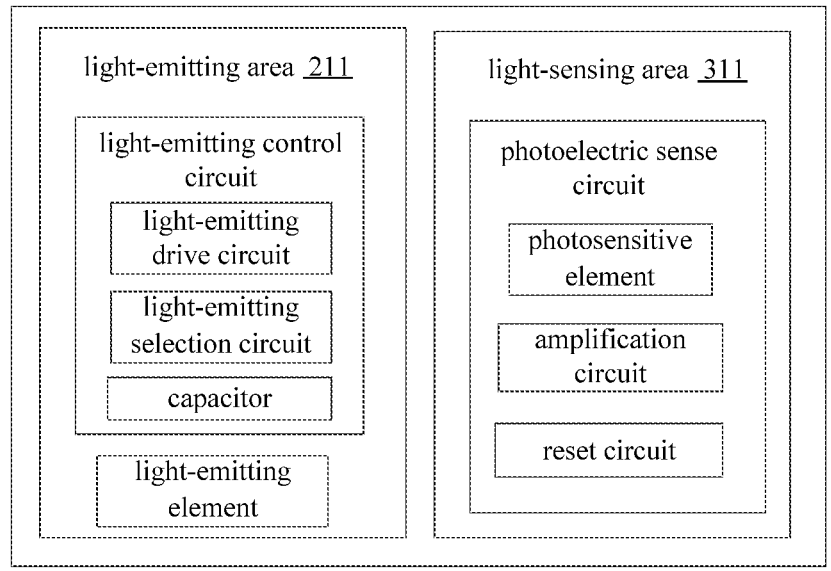
FIG. 6b is a schematic block diagram of a pixel unit of a display panel provided by an embodiment of the present disclosure.

For example, as illustrated in FIG. 6b, the light-sensing area 311 can comprise a photoelectric sense circuit, and the photoelectric sense circuit can comprise a photosensitive element (e.g. the photodiode PD in the above-mentioned embodiments of the pixel circuit), an amplification circuit (e.g. the source follow transistor M8 in the above-mentioned embodiments of the pixel circuit) and a reset circuit (e.g. the reset transistor M9 in the above-mentioned embodiments of the pixel circuit) and the like. The light-emitting area 211 can comprise a light-emitting element (e.g. the light-emitting element EL in the above-mentioned embodiments of the pixel circuit) and a light-emitting control circuit, and the light-emitting control circuit can comprise a light-emitting drive circuit (e.g. the third transistor M3 in the above-mentioned embodiments of the pixel circuit), a light-emitting selection circuit (e.g. the fifth transistor M5 in the above-mentioned embodiments of the pixel circuit) and a capacitor (e.g. the first capacitor C1 in the above-mentioned embodiments of the pixel circuit) and the like. For example, within one pixel unit 11, the light-sensing area 311 can comprise a plurality of photosensitive elements, that is, the plurality of photosensitive elements corresponds to one light-emitting element. The plurality of photosensitive elements can increase the sense electrical signal and therefore increase the precision of the touch detection and/or the fingerprint recognition. The corresponding relationship between the photosensitive element and the light-emitting element can be designed according to actual requirements, which is not limited by the embodiments of the present disclosure.

For example, according to the required precision of the touch detection and/or the fingerprint recognition, one of plural (e.g. ten) pixel units may be selected, and any one of the above-mentioned pixel circuits may be provided in the pixel unit; or, in order to achieve touch detection and/or the fingerprint recognition with a pixel-level precision, each of all pixel units 11 on the display panel 10 can comprise any one of the above-mentioned pixel circuits. For another example, each of the pixel units 11 in at least one column on the display panel 10 comprises any one of the above-mentioned pixel circuits, and each of the photoelectric sense circuits of the pixel units 11 in at least one column can share a same signal line, so as to reduce the number of the signal lines and increase the aperture ratio of the pixel unit. The sense electrical signals output from respective photoelectric sense circuits of the pixel units in one column can be read out through the signal line in a time-division manner, so as to achieve touch detection and/or fingerprint recognition functions.

For example, the display panel 10 can further comprise an output selection circuit. During the touch detection period and/or the fingerprint recognition period, the output selection circuit is configured to output the first output signal so as to control the display panel 10 to achieve the touch detection function and/or the fingerprint recognition functions. During the display period, the output selection circuit is configured to output the second output signal so as to control the display panel 10 to achieve a normal display function. Taking the pixel circuit illustrated in FIG. 4a as example, for example, in a case that the first output signal EM1 is at a low level and the second output signal EM2 is at a high level, the photosensitive switch transistor M7 is turned on, and the sixth transistor M6 is turned off. The light-emitting control circuit 120 converts the fixed signal readout voltage provided by the data signal terminal Vdata into a constant predetermined current, and the constant predetermined current is transmitted to the photoelectric sense circuit through the photosensitive switch transistor M7. In this situation, the signal line can read the sense electrical signal output from the photoelectric sense circuit, so that the display panel 10 can achieve the touch detection function and/or the fingerprint recognition function. For example, in a case that the first output signal EM1 is at a high level, and the second output signal EM2 is at a low level, the photosensitive switch transistor M7 is turned off, and the sixth transistor M6 is turned on. The light-emitting control circuit 120 converts the light-emitting data voltage provided by the data signal terminal Vdata into the light-emitting current signal, and the light-emitting current signal is transmitted to the light-emitting element EM through the sixth transistor M6, so that the display panel 10 can achieve the normal display function.

It should be noted the specific form of the output selection circuit can be designed according to practical application requirements, which is not specifically limited by the embodiments of the present disclosure.

Figure 7:
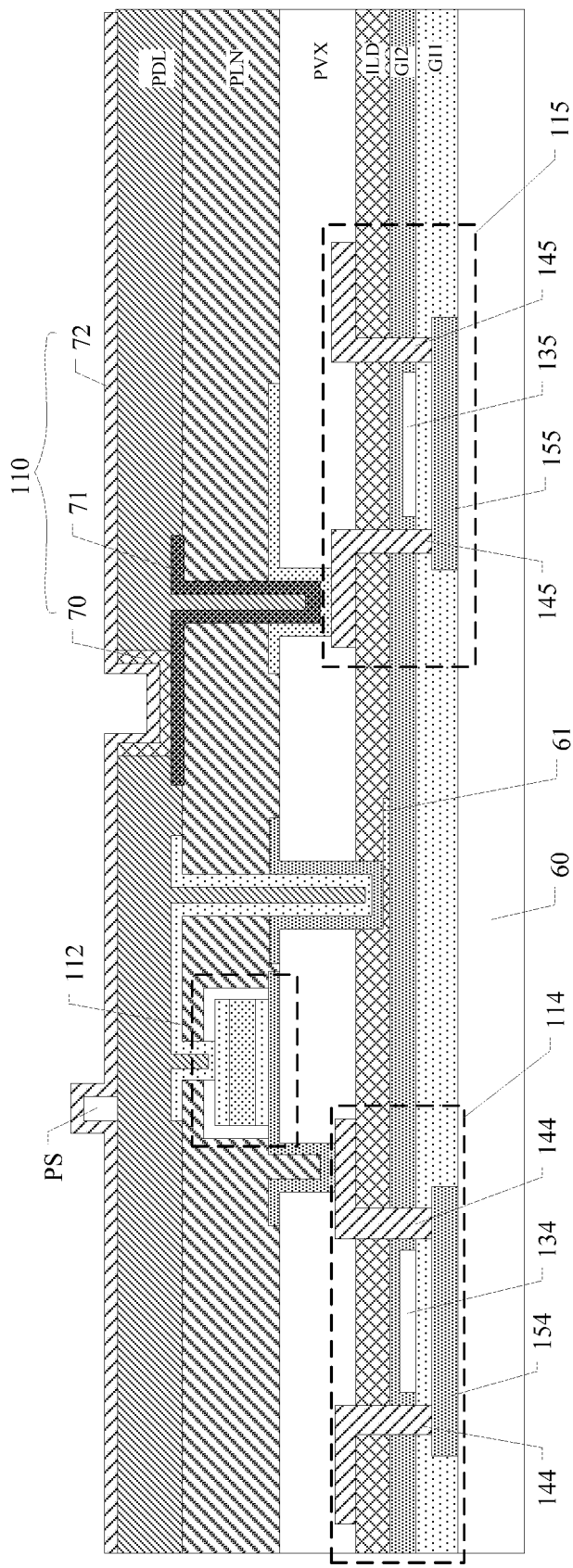
FIG. 7 is a cross-sectional structural schematic view of a pixel unit of a display panel provided by an embodiment of the present disclosure.

FIG. 7 is a cross-sectional structural schematic of a pixel unit of a display panel provided by an embodiment of the present disclosure.

For example, a pixel unit of the display panel 10 can comprise a reset transistor 114 (e.g. the reset transistor M9 in the above-mentioned embodiments of the pixel circuit), a photosensitive element 112, a light-emitting switch transistor 115 (e.g. the sixth transistor M6 in the above-mentioned embodiments of the pixel circuit) and a light-emitting element 110 which are disposed on a base substrate 60.

For example, as illustrated in FIG. 7, the rese transistor 114 is a top-gate type transistor and can comprise an active layer 154, a first gate insulation layer GI1, a gate electrode 134, a second gate insulation layer GI2, an interlayer insulation layer ILD and a source/drain electrode 144. For example, the photosensitive element 112 can comprise a positive electrode, a negative electrode and a photoelectric sensing layer disposed between the positive electrode and the negative electrode. A passivation layer PVX can be disposed between the photosensitive element 112 and the reset transistor 114. A second end of the photosensitive element 112 can be electrically connected to the source/drain electrode 144 of the reset transistor 114 through a via penetrating through the passivation layer PVX, a first end of the photosensitive element 112 can be led out through a via hole penetrating the passivation layer PVX and a planarization layer PLN and by a lead 61, and be connected with a biased voltage terminal eventually. It can be seen from FIG. 7 that the two ends of the photosensitive element 112 can be connected with a backplane circuit through via holes to achieve electrical connection.

For example, as illustrated in FIG. 7, the light-emitting switch transistor 115 can also be a top-gate type transistor and can comprise an active layer 155, a first gate insulation layer GI1, a gate electrode 135, a second gate insulation layer GI2, an interlayer insulation layer ILD and a source/drain electrode 145. The light-emitting element 110 can comprise a cathode 72, an anode 71, and a light-emitting layer 70 and a pixel defining layer PDL disposed between the anode 71 and the cathode 72. A passivation layer PVX and a planarization layer PLN can be disposed between the light-emitting element 110 and the light-emitting switch transistor 115. The anode 71 of the light-emitting element 110 can be electrically connected with the source electrode or the drain electrode 145 of the light-emitting switch transistor 115 through a via hole penetrating the passivation layer PVX and the planarization layer PLN.

For example, layers of the reset transistor 114 can be formed simultaneously with layers of the light-emitting switch transistor 115, so that the process flow of the display panel 10 can be simplified.

For example, the pixel unit can further comprise a post spacer PS to maintain the uniformity of the display panel 10. The materials of the post spacer PS can be suitable materials such as UV-cured acrylic resins. The post spacer PS can be columnar, globular and the like.

It should be noted, for clarity, FIG. 7 only illustrates the reset transistor 114, the photosensitive element 112, the light-emitting switch transistor 115 and the light-emitting element 110 of the pixel unit. The pixel unit can further comprise other structures. For example, the pixel unit can further comprise additional elements in the pixel circuit of the above-mentioned embodiments, such as the signal line, the photosensitive switch circuit and the like, and similar descriptions are not repeated here.

An embodiment of the present disclosure provides a drive method of any one of the above-mentioned pixel circuits.

Figure 8:
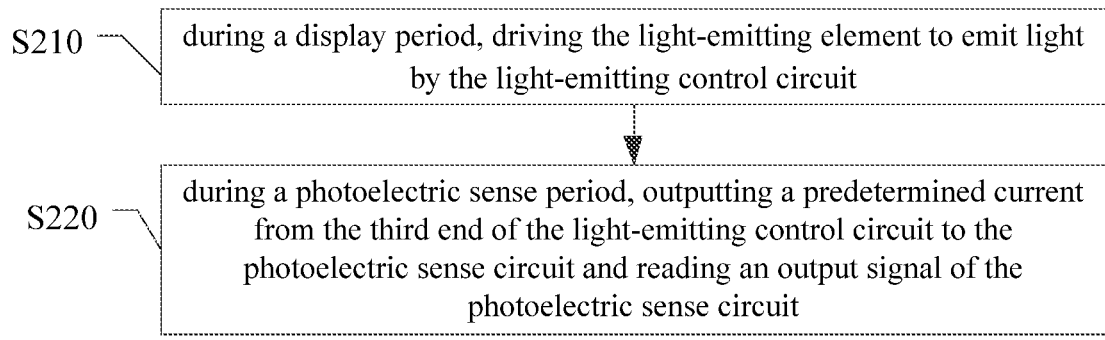
FIG. 8 is a flow chart of drive method of a pixel circuit provided by an embodiment of the present disclosure.

For example, as illustrated in FIG. 8, the drive method of the pixel circuit comprises the following operations:

S210: during a display period, driving the light-emitting element to emit light by the light-emitting control circuit;

S220: during a photoelectric sense period, outputting a predetermined current from the third end of the light-emitting control circuit to the photoelectric sense circuit and reading an output signal of the photoelectric sense circuit.

For example, during the display period, the light-emitting control circuit and the photoelectric sense circuit are disconnected. For example, the sixth transistor is turned on, and the photosensitive switch transistor is turned off, so that the predetermined current generated by the light-emitting control circuit is transmitted to the light-emitting element to drive the light-emitting element to emit light.

For example, during the photoelectric sense period, the light-emitting element and the light-emitting control circuit are disconnected. For example, the sixth transistor is turned off, and the photosensitive switch transistor is turned on, so that the predetermined current generated by the light-emitting control circuit is transmitted to the photoelectric sense circuit, that is, for example, the output signal of the photoelectric sense circuit can be read out by the signal line, so as to achieve touch detection and/or fingerprint recognition.

For example, a plurality of photoelectric sense periods can be comprised, and predetermined currents output from the third end of the light-emitting control circuit are the same during the plurality of photoelectric sense periods.

The above-mentioned operations are not performed in the order, and each display period is accompanied by a photoelectric sense period, which is not required. In a case that the time precision of the touch control is satisfied, every two or more display periods can be provided with one photoelectric sense period, so as to reduce power consumption.

For example, the timing diagram for driving the pixel circuit can be designed according to actual requirements, which is not specifically limited by the embodiments of the present disclosure. For example, FIG. 9b is an exemplary timing diagram of a drive method of the pixel circuit as illustrate in FIG. 9a. For example, as illustrated in FIG. 9b, time duration of the photoelectric sense period is less than time duration of the display period, but the embodiments of the present disclosure is not limited thereto. For example, according to practical requirements, the time duration of the photoelectric sense period can be equal to the time duration of the display period, and the time duration of the photoelectric sense period can also be equal to half or one tenth of the time duration of the display period.

Figure 9A:
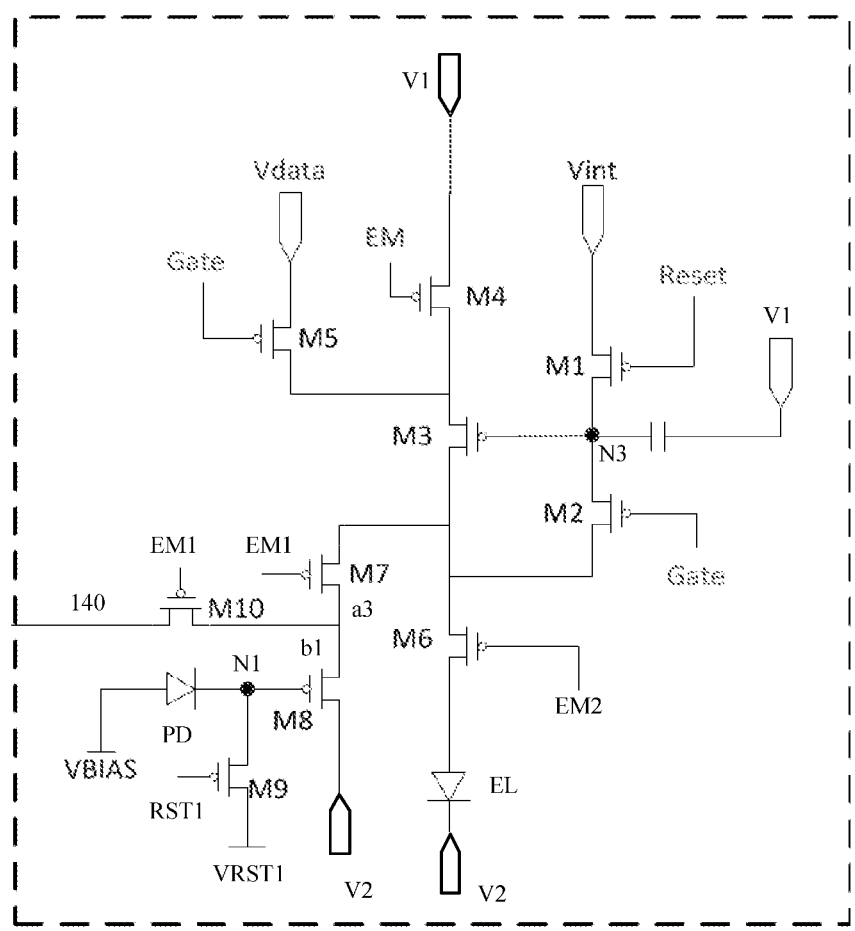
FIG. 9a is a schematic circuit diagram of another pixel circuit provided by an embodiment of the present disclosure.
Figure 9B:
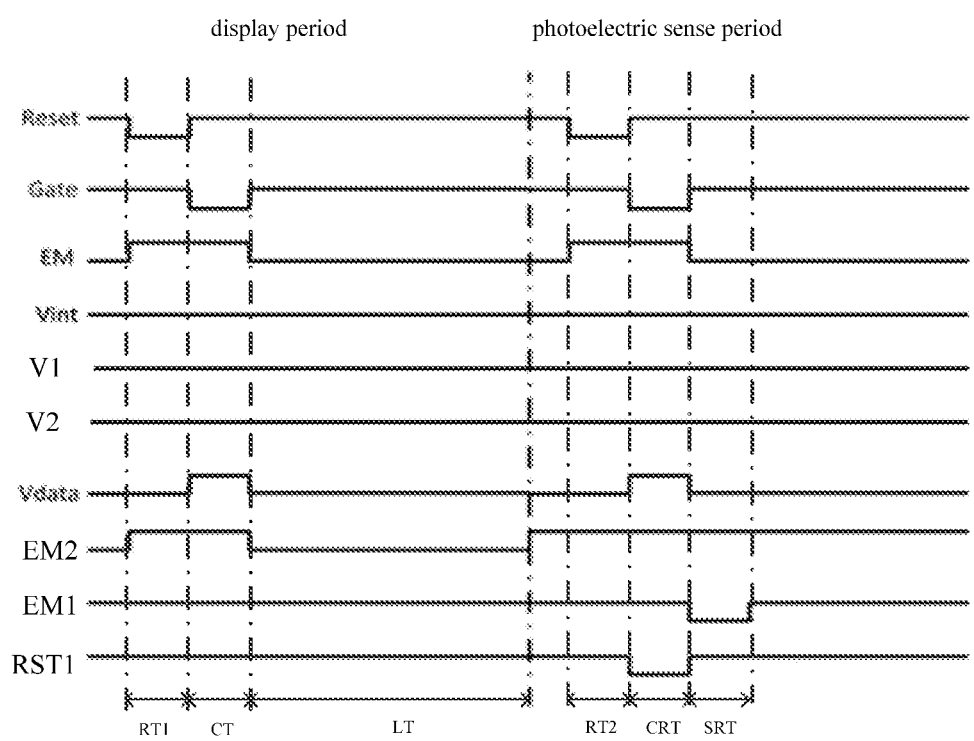

For example, as illustrated in FIG. 9a and FIG. 9b, in an example, the display period can further comprise a first reset period RT1, a compensation period CT and a light-emitting period LT.

During the first reset period RT1, the scan signal Gate, the power control signal EM, the first output signal EM1, the second output signal EM2 and the reset signal RST1 can be high level signals, and the reset signal Reset can be a low level signal, so that the first transistor M1 is turned on and other transistors are turned off. In this situation, the first transistor M1 resets a voltage of the third node N3 to an initial voltage Vint. The initial voltage Vint is a low voltage signal.

During the compensation period CT, the scan signal Gate becomes a low level signal, the reset signal Reset becomes a high level signal, and the power control signal EM, the first output signal EM1, the second output signal EM2 and the reset signal RST1 maintain to be high level signals. In this situation, the second transistor M2 and the fifth transistor M5 are turned on, and other transistors are turned off. In this way, the third node N3 is charged through the fifth transistor M5 until the voltage of the third node N3 becomes Vdata1+Vth, where Vdata1 is the light-emitting data voltage output from the data signal terminal Vdata, and Vth is a threshold voltage of the third transistor M3. The voltage Vdata1+Vth is stored in the second capacitor C2. At this moment, a voltage on the control electrode of the third transistor M3 is Vdata1+Vth.

During the light-emitting period LT, the scan signal Gate becomes a high level signal, the second output signal EM2 and the power control signal EM become low level signals, and the first output signal EM1, the reset signal Reset and the reset signal RST1 maintain to be high level signals. In this situation, the third transistor M3, the fourth transistor M4 and the sixth transistor M6 are in an on state, and other transistors are in an off state. In this way, the light-emitting current signal flowing through the third transistor M3 is transmitted to the light-emitting element EL by the sixth transistor M6, and the light-emitting element EL is driven to emit light corresponding to the light-emitting data voltage.

Based on the saturation current formula of a transistor, the light-emitting current signal flowing through the third transistor M3 can be obtained as follows:

$$Iout=K(VGS-Vth)^2=K[Vdata1+Vth-V1-Vth]^2=K(Vdata1-V1)^2$$

It can be seen from the above formula that the output current Iout is not affected by the threshold voltage Vth of the third transistor M3, that is, the current Iout driving the light-emitting element EL to emit light is not affected by the threshold voltage Vth of the third transistor M3. In this way, the threshold voltage drift problem of the third transistor M3 can be compensated by the light-emitting control circuit.

During the light-emitting period, the first output signal EM1 maintains to be a high level signal, so that the photosensitive switch transistor M7 is in an off state, that is, the light-emitting current signal generated by the light-emitting control circuit cannot be transmitted to the photoelectric sense circuit. In this way, the signal line cannot read out the sense electrical signal output by the photoelectric sense circuit, and the pixel circuit implements the normal display function.

For example, as illustrated in FIG. 9a and FIG. 9b, in an example, the photoelectric sense period comprises a second reset period RT2, a compensation reset period CRT and a signal readout period SRT.

For example, the second reset period RT2 is same as the first reset period RT1, and the similar descriptions are not repeated herein.

During the compensation reset period CRT, the scan signal Gate and the reset signal RST1 become low level signals, the reset signal Reset becomes a high level signal, and the power control signal EM, the first output signal EM1 and the second output signal EM2 maintain to be high level signals. In this situation, the second transistor M2 and the fifth transistor M5 are turned on, so that the third node N3 is charged through the fifth transistor M5 until the voltage of the third node N3 is Vdata2+Vth, where Vdata2 is the signal readout voltage output from the data signal terminal Vdata, and Vth is the threshold voltage of the third transistor M3. The voltage Vdata2+Vth is stored in the second capacitor C2. In this situation, the voltage on the control electrode of the third transistor M3 is Vdata2+Vth. Meanwhile, the reset transistor M9 is turned on, and the reset voltage is written into the first node N1 through the reset transistor M9. The reset voltage can be a reference voltage and the reference voltage can be a high level voltage. During this period, other transistors are turned off.

For example, the signal readout voltage Vdata2 keep unchanged during respective photoelectric sense periods, so that the constant predetermined current can be obtained from the third end of the light-emitting control circuit. Or, the signal readout voltage Vdata2 changes according to practical requirements during respective photoelectric sense periods, so that the required predetermined current can be obtained from the third end of the light-emitting control circuit.

During the signal readout period SRT, the scan signal Gate and the reset signal RST1 become high level signals, the power control signal EM and the first output signal EM1 become low level signals, and the reset signal Reset and the second output signal EM2 maintain to be high level signals. In this situation, the third transistor M3 and the fourth transistor M4 are turned on, and the light-emitting control circuit converts the signal readout voltage Vdata2 transmitted by the data signal terminal Vdata into a constant predetermined current and transmits the constant predetermined current to the third end a3 thereof. The photosensitive switch transistor M7 is turned on, so that the predetermined current output from the third end a3 of the light-emitting control circuit can be transmitted to the sense signal output end b1 of the photoelectric sense circuit through the photosensitive switch transistor M7. In this way, the sense electrical signal generated by the photosensitive element PD can be followed to the sense signal output end b1 through the source follow transistor M8, and then can be read out through the signal line 140.

It should be noted that the signal readout period SRT illustrated in FIG. 9b only illustrates the time sequence for reading the sense electrical signal of the photoelectric sense circuit of one sub-pixel. For example, each photoelectric sense period can comprise a plurality of signal readout periods SRT, so as to read out the sense electrical signals of the photoelectric sense circuits in a plurality of different sub-pixels in a time-division manner.

During the photoelectric sense period, the second output signal EM2 maintains to be a high level signal, so that the sixth transistor M6 is in an off state, that is, the predetermined current generated by the light-emitting control circuit cannot be transmitted to the light-emitting element EL. In this way, the light-emitting element EL does not emit light, and the pixel circuit implements the touch detection function and/or the fingerprint recognition function.

The photoelectric sense circuit in a pixel circuit provided by at least one embodiment of the present disclosure adopts an active detection manner and time-multiplexes the constant predetermined current generated by the light-emitting control circuit. In this way a high-precision detection of the sense electrical signal is achieved and the signal-to-noise ratio of the sense electrical signal is increased. Further, the space occupied by the photoelectric sense circuit is reduced, the structural layout of the pixel circuit is optimized, the manufacturing cost is reduced, and the additional value of the products is promoted.

Obviously, those skilled in the art can make various changes and the modifications to the present disclosure without departing from the spirit and the scope of the present disclosure. In this way, so far as these changes and modifications fall within the scope of the claims and their equivalents of the present disclosure, the present invention shall also intend to cover such changes and the modifications.

What have been described above is related to the illustrative embodiments of the disclosure only, the protection scope of the disclosure is not limited thereto, and the scopes of the disclosure are defined by the accompanying claims.

What is claimed is:

1. A pixel circuit, comprising a light-emitting element, a light-emitting control circuit and a photoelectric sense circuit,
   wherein the light-emitting control circuit is configured to drive the light-emitting element to emit light and comprises a first end, a second end and a third end; the first end is configured to be connected with a first power supply terminal, and the second end is configured to be connected with the light-emitting element;
   one end of the light-emitting element is configured to be connected with the second end of the light-emitting control circuit, and other end of the light-emitting element is configured to be connected with a second power supply terminal; and
   the photoelectric sense circuit is configured to sense light incident on the photoelectric sense circuit to generate a sense electrical signal and comprises a sense signal output end and a sense voltage input end, the sense voltage input end is configured to be connected with the second power supply terminal, and the sense signal output end is configured to be connected with the third end of the light-emitting control circuit,
   the light-emitting control circuit is configured to generate a predetermined current and input the predetermined current to the sense signal output end of the photoelectric sense circuit through the third end, such that the sense electrical signal generated by the photoelectric sense circuit is output to the sense signal output end of the photoelectric sense circuit, and the predetermined current is constant;
   wherein the light-emitting control circuit comprises: a light-emitting drive circuit and a photosensitive switch circuit,
   a first end of the light-emitting drive circuit is connected with the photosensitive switch circuit, a second end of the light-emitting drive circuit is connected with the first power supply terminal;
   the light-emitting drive circuit is configured to control a current flowing between the first end and the second end for driving the light-emitting element to emit light, and further configured to control the predetermined current flowing between the first end and the third end;
   the photosensitive switch circuit is disposed between the first end of the light-emitting drive circuit and the sense signal output end of the photoelectric sense circuit, and is configured to control whether the predetermined current is transmitted from the light-emitting control circuit to the photoelectric sense circuit or not.

2. The pixel circuit according to claim 1, further comprising a signal line,
   wherein the signal line is configured to receive the sense electrical signal output from the sense signal output end of the photoelectric sense circuit.

3. The pixel circuit according to claim 2, further comprising a signal readout switch circuit,
   wherein the signal line comprises a first portion and a second portion, the signal readout switch circuit is disposed between the first portion and the second portion and is configured to control connection or disconnection between the first portion and the second portion, and the first portion is configured to be connected with the sense signal output end of the photoelectric sense circuit.

4. The pixel circuit according to claim 2, wherein the light-emitting control circuit further comprises: a light-emitting selection circuit and a capacitor,
   a control end of the light-emitting drive circuit is connected with the capacitor,
   the light-emitting selection circuit is configured to write a data signal into a control end of the light-emitting drive circuit; and the capacitor is configured to store the data signal and maintain the data signal at the control end of the light-emitting drive circuit.

5. The pixel circuit according to claim 2, wherein the photoelectric sense circuit comprises a photosensitive element and an amplification circuit, the photosensitive element is configured to convert light incident on the photosensitive element to the sense electrical signal, and the amplification circuit is configured to amplify the sense electrical signal output by the photosensitive element.

6. The pixel circuit according to claim 1, wherein the light-emitting control circuit further comprises: a light-emitting selection circuit and a capacitor, a control end of the light-emitting drive circuit is connected with the capacitor, the light-emitting selection circuit is configured to write a data signal into a control end of the light-emitting drive circuit; and the capacitor is configured to store the data signal and maintain the data signal at the control end of the light-emitting drive circuit.

7. The pixel circuit according to claim 6, wherein the light-emitting control circuit further comprises a light-emitting compensation circuit configured to compensate the light-emitting drive circuit.

8. The pixel circuit according to claim 6, wherein the light-emitting control circuit further comprises a light-emitting switch circuit, and the light-emitting switch circuit is disposed between the light-emitting drive circuit and the light-emitting element and is configured to control connection or disconnection between the light-emitting drive circuit and the light-emitting element.

9. The pixel circuit according to claim 6, wherein the photoelectric sense circuit comprises a photosensitive element and an amplification circuit, the photosensitive element is configured to convert light incident on the photosensitive element to the sense electrical signal, and the amplification circuit is configured to amplify the sense electrical signal output by the photosensitive element.

10. The pixel circuit according to claim 1, wherein the photoelectric sense circuit comprises a photosensitive element and an amplification circuit, the photosensitive element is configured to convert light incident on the photosensitive element to the sense electrical signal, and the amplification circuit is configured to amplify the sense electrical signal output by the photosensitive element.

11. The pixel circuit according to claim 10, wherein the amplification circuit comprises a source follow transistor comprising a control electrode, a first electrode and a second electrode;

one end of the photosensitive element is connected with a biased voltage terminal and other end of the photosensitive element is configured to control the control electrode of the source follow transistor, the first electrode of the source follow transistor is connected with the sense signal output end of the photoelectric sense circuit, and the second electrode of the source follow transistor is connected with the sense voltage input end of the photoelectric sense circuit.

12. The pixel circuit according to claim 11, wherein the photoelectric sense circuit further comprises a reset circuit, and the reset circuit is connected between the photosensitive element and the amplification circuit and is configured to reset an output signal of the photosensitive element.

13. The pixel circuit according to claim 10, wherein the photoelectric sense circuit further comprises a reset circuit, and the reset circuit is connected between the photosensitive element and the amplification circuit and is configured to reset an output signal of the photosensitive element.

14. The pixel circuit according to claim 10, wherein the photoelectric sense circuit further comprises a buffer switch circuit, and the buffer switch circuit is disposed between the photosensitive element and the amplification circuit and is configured to control connection or disconnection between the photosensitive element and the amplification circuit.

15. A display panel, comprising pixel units arranged in an array, wherein at least one of the pixel units comprises the pixel circuit according to claim 1.

16. A drive method of the pixel circuit according to claim 1, comprising:

during a display period, driving the light-emitting element to emit light by the light-emitting control circuit;

during a photoelectric sense period, generating and outputting the predetermined current from the third end of the light-emitting control circuit to the photoelectric sense circuit and reading the sense electrical signal of the photoelectric sense circuit.

17. The drive method according to claim 16, wherein during the display period, the light-emitting control circuit and the photoelectric sense circuit are disconnected.

18. The drive method according to claim 16, comprising a plurality of photoelectric sense periods, wherein predetermined currents output from the third end of the light-emitting control circuit are same during the plurality of photoelectric sense periods.

19. The pixel circuit according to claim 1, wherein the light-emitting control circuit further comprises a light-emitting compensation circuit configured to compensate the light-emitting drive circuit.

* * * * *